United States Patent
Dong et al.

(10) Patent No.: US 12,302,650 B2
(45) Date of Patent: May 13, 2025

(54) IMAGE SENSOR AND METHOD FOR FABRICATING THE SAME

(71) Applicant: OMNIVISION TECHNOLOGIES (SHANGHAI) CO., LTD., Shanghai (CN)

(72) Inventors: Liqun Dong, Shanghai (CN); Haibo Xiao, Shanghai (CN); Shuaibing Lin, Shanghai (CN); Xinzhi Dai, Shanghai (CN)

(73) Assignee: OMNIVISION TECHNOLOGIES (SHANGHAI) CO., LTD., Shanghai (CN)

(*) Notice: Subject to any disclaimer, the term of this patent is extended or adjusted under 35 U.S.C. 154(b) by 474 days.

(21) Appl. No.: 17/822,654

(22) Filed: Aug. 26, 2022

(65) Prior Publication Data

US 2024/0006455 A1    Jan. 4, 2024

(30) Foreign Application Priority Data

Jun. 30, 2022 (CN) .......................... 202210771708.1

(51) Int. Cl.
    *H10F 39/00*      (2025.01)
    *H10F 39/18*      (2025.01)

(52) U.S. Cl.
    CPC ............ *H10F 39/18* (2025.01); *H10F 39/014* (2025.01); *H10F 39/807* (2025.01)

(58) Field of Classification Search
    CPC ...... H10F 39/18; H10F 39/014; H10F 39/807; H10D 84/80; H10D 30/611; H10D 89/921; A23B 2/70; A61K 40/4225
    See application file for complete search history.

(56) References Cited

U.S. PATENT DOCUMENTS

| | | |
|---|---|---|
| 9,111,993 B1 | 8/2015 | Zheng et al. |
| 2015/0318319 A1 | 11/2015 | Peng et al. |
| 2016/0056200 A1 | 2/2016 | Lee et al. |
| 2016/0204143 A1 | 7/2016 | Lee et al. |
| 2016/0211290 A1 | 7/2016 | Tsai et al. |
| 2021/0335861 A1* | 10/2021 | Cheng ................. H01L 27/1469 |

FOREIGN PATENT DOCUMENTS

| | | |
|---|---|---|
| CN | 103403869 A | 11/2013 |
| CN | 109686748 A | 4/2019 |
| CN | 113078175 A | 7/2021 |
| CN | 113178458 A | 7/2021 |
| CN | 114388541 A | 4/2022 |
| WO | 2021/215290 A1 | 10/2021 |

* cited by examiner

*Primary Examiner* — Elias Ullah
(74) *Attorney, Agent, or Firm* — WOMBLE BOND DICKINSON (US) LLP

(57) ABSTRACT

The present invention provides an image sensor and a method for fabricating the image sensor. The image sensor includes a semiconductor substrate, photodiodes (PD), deep isolation trenches, first deep P-well blocks and second deep P-wells. The isolation trenches surrounds the PDs, and each of the isolation trenches is separated from any adjacent isolation trenches at a crossing where they would have crossed each other if they further extended. The first deep P-wells blocks have projections on the semiconductor substrate, which encompass projections of said separated portions of the isolation trenches on the semiconductor substrate. The first P-well blocks can be formed using only one photomask, resulting in a reduction in cost.

11 Claims, 6 Drawing Sheets

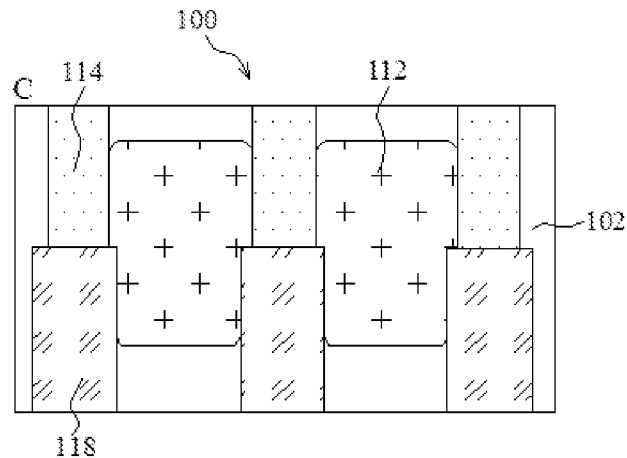

Fig. 11

```
providing a semiconductor substrate having a first side and a second side
opposite to the first side, wherein a plurality of photodiodes (PDs) are
formed in the semiconductor substrate
```
— S1

```
forming deep isolation trenches surrounding portions of the PDs close to the
second side, wherein the isolation trench extends from the second side toward the
first side of the semiconductor substrate , and wherein each isolation trench is
separated from any adjacent deep isolation trenches at a crossing where the
isolation trenches would have crossed each other if further extended
```
— S2

```
forming first deep P-well blocks by a first P-type ion implantation, wherein
projections of the first deep P-well blocks on the semiconductor substrate
encompass projections of separated portions of any adjacent isolation trenches
on the semiconductor substrate, the first deep P-well block extending from the
second side toward the first side of the semiconductor substrate
```
— S3

```
forming second deep P-wells by a second P-type ion implantation,
wherein the second deep P-wells surrounding portions of the PDs close
to the first side, the second deep P-well extending from the first side
toward the second side of the semiconductor substrate
```
— S4

Fig. 12

IMAGE SENSOR AND METHOD FOR FABRICATING THE SAME

CROSS-REFERENCE TO RELATED APPLICATION

This application claims the priority of Chinese patent application number 202210771708.1, filed on Jun. 30, 2022, the entire contents of which are incorporated herein by reference.

TECHNICAL FIELD

The present invention relates to the field of integrated circuit fabrication technology and, in particular, to an image sensor and a method for fabricating the image sensor.

BACKGROUND

CMOS image sensors (CIS) have been extensively used in digital still cameras, cellular phones, security cameras, medical, automobile, and other applications. A typical image sensor operates in response to the incidence of image light reflected from an external scene on the image sensor. Such an image sensor includes an array of pixels having photosensitive elements (e.g., photodiodes). Each photosensitive element absorbs a part of the incident image light and immediately generates an image charge upon the absorption. The image charge of each pixel can be measured as an output voltage of the photosensitive element that varies with the incident image light. In other words, the amount of the image charge generated is proportional to the intensity of the image light, and the image light is utilized to produce a digital image representing the external scene.

As the requirements of CIS applications are becoming increasingly demanding, associated pixels are being required to continue shrinking in size in order to arrange more pixels within a same area. From the point of view of pixel design, this also leads to a smaller and smaller pixel-to-pixel pitch. Small pixels are advantageous in that more pixels can be arranged within a same area. A clearer image of a higher definition means a full-well capacity as high as that of a large pixel achieved at a smaller photosensitive area. In order to obtain such a comparable full-well capacity at a smaller area, a photodiode (PD) has to be increased in depth. This requires deeper implantation of N-type ions for forming PDs and P-type ions for isolating each PD. For a CIS chip, deep P-wells (DPWs) are a choice for isolating the PD in each pixel. However, the formation of such a layer involving the implantation of a high dose of ions, requires a relatively thick photoresist (e.g., >2 μm). At a given high aspect ratio of photoresist, a reduced pixel-to-pixel pitch means an exponential increase in a process complexity and a higher process cost. Moreover, thick photoresist has been identified as a source of white pixels in a resulting image sensor, which degrade the sensor's pixel quality.

SUMMARY OF THE INVENTION

It is an object of the present invention to provide an image sensor and a method for fabricating the image sensor, which allow reduced process cost, less white pixels and improved pixel quality while being free of blooming and crosstalk problems.

The present invention provides an image sensor, comprising:

a semiconductor substrate having a first side and a second side opposite to the first side; and
a plurality of image sensor units, wherein each image sensor unit comprises:
four deep isolation trenches formed in the semiconductor substrate and substantially arranged in a rectangle, wherein the four deep isolation trenches are separated from one another at four corners of the rectangle, and wherein each deep isolation trench extends from the second side to the first side of the semiconductor substrate;
four first deep P-well blocks formed in the semiconductor substrate and located at the four corners of the rectangle, wherein each first P-well block extends from the second side to the first side of the semiconductor substrate;
four second deep P-wells formed in the semiconductor substrate and in positional correspondence with the four deep isolation trenches, wherein each second P-well extends from the first side to the second side of the semiconductor substrate; and
an photodiode (PD) formed in the semiconductor substrate, wherein a portion of the photodiode close to the second side is surrounded by the four deep isolation trenches and the four first deep P-well blocks, and wherein a portion of the photodiode close to the first side is surrounded by the four second deep P-wells.

Additionally, a width of the second deep P-well may be greater than a width of the deep isolation trench.

Additionally, each end of the deep isolation trench may contact with or extend into the first deep P-well block in a lateral direction.

Additionally, in a thickness direction of the semiconductor substrate, the second deep P-well may contact or partially overlap with the deep isolation trench.

Additionally, in a thickness direction of the semiconductor substrate, the first deep P-well block and the deep isolation trench may extend a substantially same depth from the second side to the first side of the semiconductor substrate.

The present invention also provides a method for fabricating an image sensor including at least one image sensor unit, comprising:

providing a semiconductor substrate having a first side and a second side opposite to the first side; and
forming a plurality of deep isolation trenches in the semiconductor substrate, wherein the plurality of deep isolation trenches comprise four deep isolation trenches that are substantially arranged in a rectangle, wherein the four deep isolation trenches are separated from one another at four corners of the rectangle, and wherein each deep isolation trench extends from the second side to the first side of the semiconductor substrate;
forming a plurality of first deep P-well blocks in the semiconductor substrate, wherein the plurality of first deep P-well blocks comprise four first deep P-well blocks located at the four corners of the rectangle, wherein each first P-well block extends from the second side to the first side of the semiconductor substrate;
forming a plurality of second deep P-wells in the semiconductor substrate, wherein the plurality of second deep P-wells comprise four second deep P-wells in positional correspondence with the four deep isolation trenches, wherein each second P-well extends from the first side to the second side of the semiconductor substrate; and forming at least one photodiode in the semiconductor substrate, wherein a portion of the photodiode close to the second side is surrounded by the four deep isolation trenches and the four first deep P-well blocks, and wherein a portion of the photodiode close to the first side is surrounded by the four second deep P-wells.

Additionally, the first deep P-well block may be formed using an implantation energy greater than an implantation energy used to form the second deep P-well.

Additionally, a width of the second deep P-well may be greater than a width of the deep isolation trench.

Additionally, each end of the deep isolation trench may contact with or extend into the first deep P-well block in a lateral direction.

Additionally, in a thickness direction of the semiconductor substrate, the second deep P-well may contact or partially overlap with the deep isolation trench.

Additionally, in a thickness direction of the semiconductor substrate, the first deep P-well block and the deep isolation trench may extend a substantially same depth from the second side to the first side of the semiconductor substrate.

Compared with the prior art, the present invention offers the following benefits:

The present invention provides an image sensor and a method for fabricating the image sensor. The image sensor includes: a semiconductor substrate having a first side and an opposing second side; PDs in the semiconductor substrate; deep isolation trenches surrounding portions of the PDs close to the second side, the deep isolation trenches extending from the second side toward the first side of the semiconductor substrate, each deep isolation trench separated from any adjacent deep isolation trenches at a crossing where they would have crossed each other if they further extended; second deep P-wells surrounding portions of the PDs close to the first side, the second deep P-wells extending from the first side toward the second side of the semiconductor substrate; and first deep P-well blocks having projections on the semiconductor substrate, which encompass projections of said separated portions of any adjacent deep isolation trenches on the semiconductor substrate, the first deep P-well blocks extending from the second side toward the first side of the semiconductor substrate.

According to the present invention, the first P-well block can be formed in a single photolithography process using only one photomask, as shape maintenance of photoresist is enabled because of a sufficient spacing between adjacent first deep P-well blocks. This structural design of the first deep P-well blocks according to the present invention results in reduced process cost and a shortened process time. Additionally, according to the present invention, as each of the deep isolation trenches surrounding the PDs is separated from any adjacent deep isolation trenches at a crossing where they would have crossed each other if they further extended, the image sensor is greatly improved in terms of white pixels. Further, the projections of the first deep P-well blocks on the semiconductor substrate encompass the projections of the separated portions of the deep isolation trenches on the semiconductor substrate. The separated portions between any adjacent deep isolation trenches are arranged in the first P-deep well blocks. The first deep P-well blocks are formed by implantation of P-type ions, which repairs damage caused by plasma used in a dry etching process for forming trenches for the deep isolation trenches, additionally reducing white pixels and increasing pixel quality. Furthermore, the first deep P-well blocks provide electrical isolation at the separated portions between any adjacent deep isolation trenches. This avoids the phenomenon that a large number of electrons flow from a PD toward adjacent PDs, addressing the blooming and crosstalk problems that may arise from the discontinuation of the deep isolation trenches at the separated portions.

BRIEF DESCRIPTION OF THE DRAWINGS

FIG. 11 is a schematic cross-sectional view of the image sensor according to an embodiment of the present invention taken along the C direction.

FIG. 12 is a flow diagram of a method for fabricating an image sensor according to an embodiment of the present invention.

DESCRIPTION OF REFERENCE NUMERALS IN DRAWINGS

001: Image Sensor; 002: Semiconductor Substrate; 004: First Side; 006: Second Side; 012: Photodiode (PD); 014: Deep P-well (DPW); 016: Deep Isolation Trench; 018: Deeper P-well; 017: Deep Isolation Trench; a: First Wall; b: Second Wall; c: Third Wall; d: Fourth Wall;

100: Image Sensor; 102: Semiconductor Substrate; 104: First Side; 106: Second Side; 112: PD; 114: Second Deep P-well; 116: Deep Isolation Trench; 118: First Deep P-well block.

DETAILED DESCRIPTION

As outlined in the Background section, image sensors are being required to shrink in pixel size, and a deep P-well process involved in the formation of a CIS chip requires the use of thick photoresist, leading to a high process complexity and a high process cost. Thick photoresist has been identified as a source of white pixels, which degrade pixel quality of an image sensor.

Figure 1:
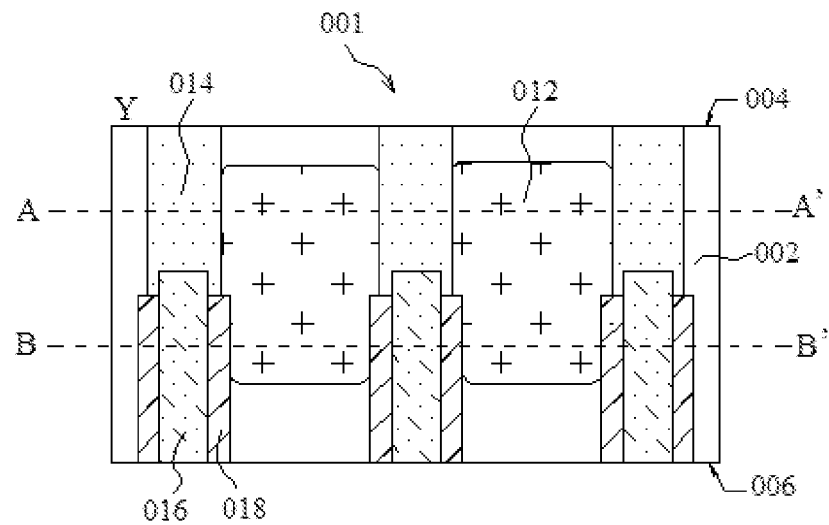
FIG. 1 is a schematic cross-sectional view of an image sensor taken along a Y direction.
Figure 2:
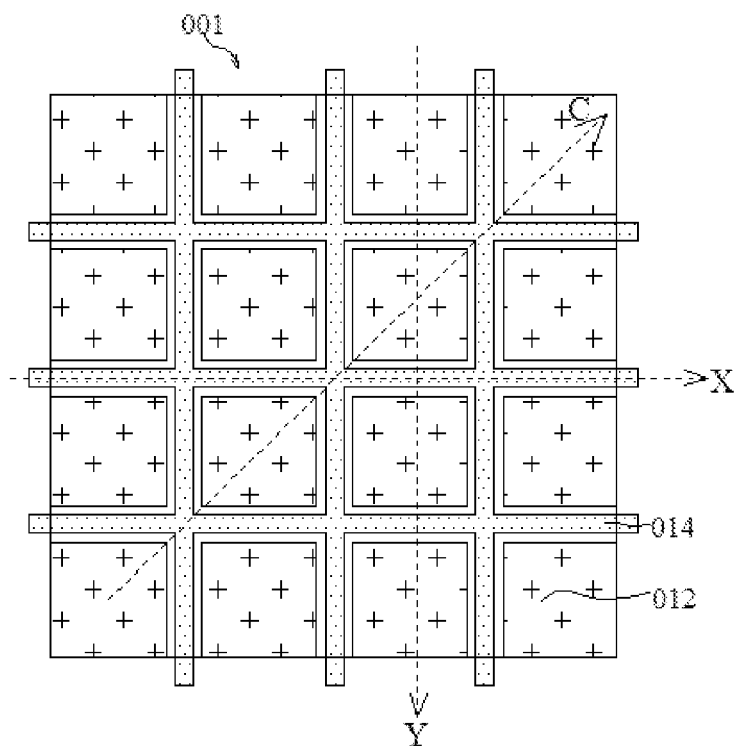
FIG. 2 is a schematic cross-sectional view of the image sensor taken along AA' in FIG. 1.
Figure 3:
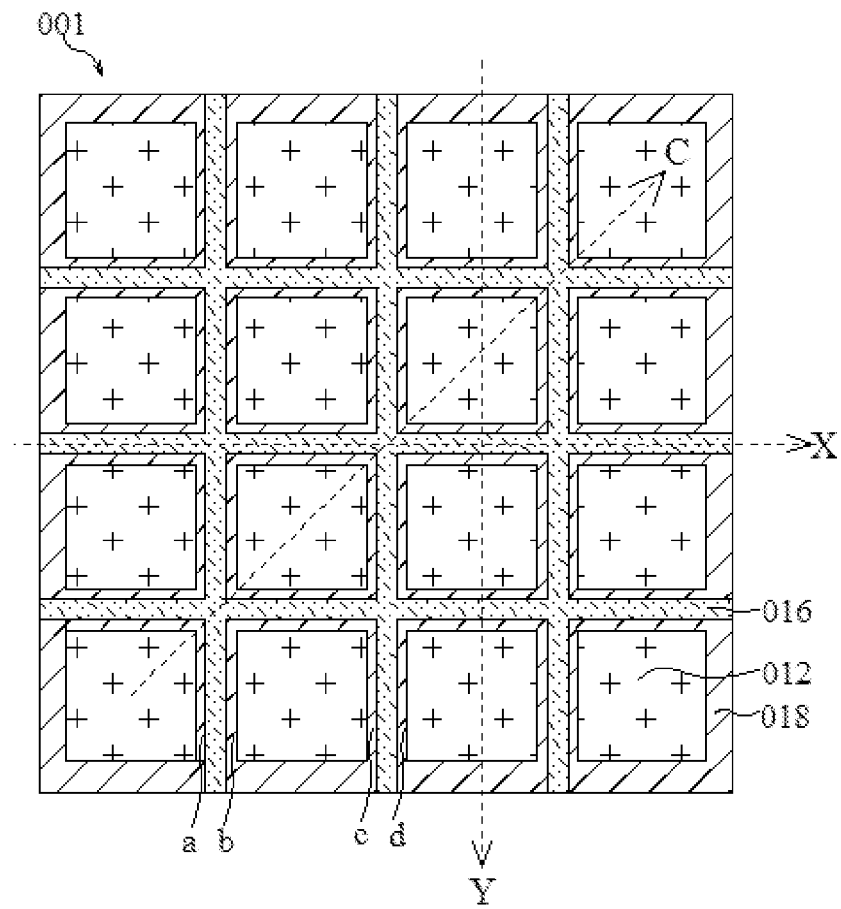
FIG. 3 is a schematic cross-sectional view of the image sensor taken along BB' in FIG. 1.
Figure 4:
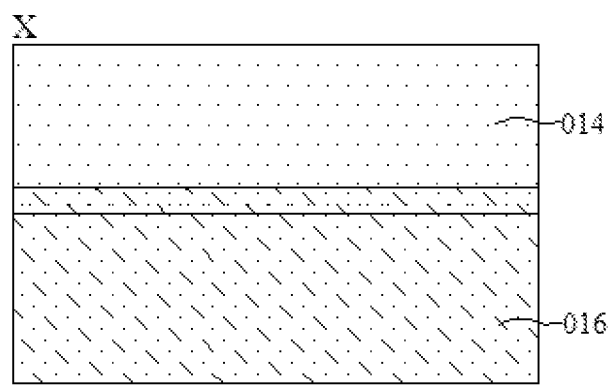
FIG. 4 is a schematic cross-sectional view of the image sensor taken along an X direction.
Figure 5:
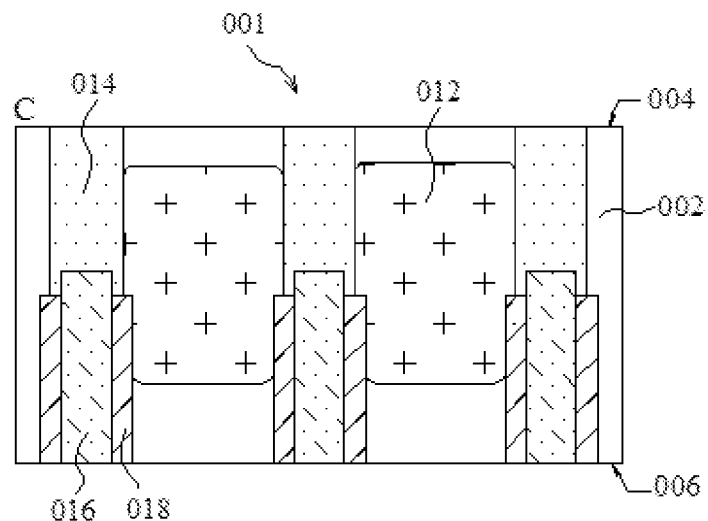
FIG. 5 is a schematic cross-sectional view of the image sensor taken along a C direction.

FIG. 1 is a schematic cross-sectional view (perpendicular to top and bottom surfaces of a semiconductor substrate) of an image sensor taken along a Y direction. FIG. 2 is a schematic cross-sectional view (parallel to the top and bottom surfaces of the semiconductor substrate) of the image sensor taken along AA' in FIG. 1. FIG. 3 is a schematic cross-sectional view of the image sensor taken along BB' in FIG. 1. FIG. 4 is a schematic cross-sectional view of the image sensor taken along an X direction. FIG. 5 is a schematic cross-sectional view of the image sensor taken along a C (diagonal) direction.

As shown in FIGS. 1 to 5, the image sensor 001 includes a semiconductor substrate 002, photodiodes (PDs) 012, deep P-well 014, deeper P-well 018 and deep isolation trench 016.

The semiconductor substrate 002 has a first side 004 and a second side 006 opposite to the first side 004. The deep P-wells 014 extend from the first side 004 toward the second side 006 of the semiconductor substrate 002. The deep P-wells 014 include a plurality of deep wells I extending in the first direction X and a plurality of deep wells II which extend in the second direction Y and cross the deep wells I to form a deep well lattice. The deep isolations trenches 016 extend from the second side 006 toward the first side 004 of the semiconductor substrate 002. The deep isolations trenches 016 include a plurality of isolation trenches I extending in the first direction X and a plurality of isolation trenches II which extend in the second direction Y and cross the isolation trenches I to form an isolation trench lattice. The lattice formed by the isolation trenches 016 is internally lined with the deeper P-wells 018 that are arranged in an annular shape. In this way, each side of the isolation trench in the isolation trench lattice is provided with a deeper P-well 018. The annular deeper P-wells 018 may be arranged in an array. The deeper P-wells 018 extend from the second side 006 toward the first side 004 of the semiconductor substrate 002.

Each of the PDs 012 in the image sensor 001 has a portion close to the first side 004, which is surrounded by the deep well lattice of the deep P-well 014, and another portion close to the second side 006, which is surrounded by the deeper P-well 018. Every adjacent PDs 012 are spaced apart by two deeper P-wells 018. Therefore, the deeper P-wells 018 are also called double spacers.

Formation of the deeper P-wells 018 may involve: coating the semiconductor substrate 002 with a thick layer of photoresist; forming openings in the photoresist by exposure, which are in positional correspondence with the deeper P-wells 018 to be formed; and then implanting P-type ions through the openings to form the deeper P-wells 018.

As shown in FIG. 3, the increasing shrinkage of pixels is leading to a smaller and smaller pixel-to-pixel pitch and hence spacing between adjacent PDs 012. Consequently, the width of the deeper P-well 018 and width of the deep isolation trench 016 are both required to be very small. For instance, each deeper P-well 018 includes a first wall a, a second wall b, a third wall c and a fourth wall d. During to a very limited spacing between adjacent PDs 012, the walls width of the deeper P-wells 018, as well as the spacing between adjacent deeper P-well walls 018 (i.e., a width of the deep isolation trench 016), are narrow, and it is therefore difficult to simultaneously form the first walls a and the second walls b in a single photolithography process because the limited widths of the first and second walls a, b themselves and of the spacing between them make it difficult for the photoresist to maintain a desired shape and easy to collapse.

In view of this, the formation of the deeper P-well walls 018 could involve two photolithography processes using two different photomasks (reticles). The first photomask may include, for example, pattern features for the first and third walls a, c, and as a result of the first photolithography process using the first photomask, the first and third walls a, c of the deeper P-well walls 018 can be formed. The second photomask may include pattern features for the second and fourth walls b, d, and as a result of the second photolithography process using the second photomask, the second and fourth walls b, d of the deeper P-well walls 018 can be formed. In this way, openings formed using the first photomask will be spaced apart by the distance between the first and third walls a, c, which is large enough to allow the photoresist to maintain its shape.

However, as the formation of the deeper P-well walls 018 in the image sensor 001 involves two photolithography processes using two different photomasks (reticles), the process cost is high and the thick photoresist used may become a source of white pixels in the image sensor, which affect pixel quality of the image sensor.

In order to develop an image sensor with improved pixel performance, reduced white pixels arising from the use of thick photoresist and reduced process cost, the inventors have made various attempts, including pixel optimization by removing the deeper P-well walls 018 in the image sensor 001, which, however, was found to lead to significantly increased white pixels. In addition, the inventors have also attempted to modify and optimize the deep isolation trenches 016.

As shown in FIG. 3, before the modification, the deep isolation trenches 016 includes a plurality of isolation trenches I extending in the first direction X and a plurality of isolation trenches II that extend in the second direction Y and cross the isolation trenches I to form trench an isolation lattice.

Figure 6:
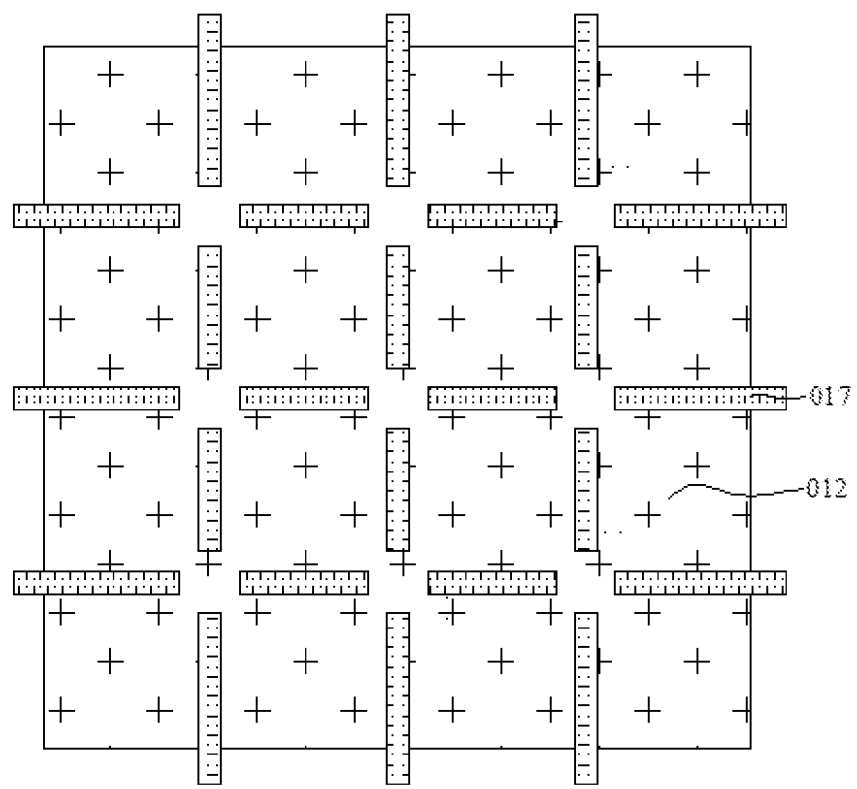
FIG. 6 is a schematic cross-sectional view of the image sensor with modified deep isolation trenches.

As shown in FIGS. 3 and 6, compared with the original deep isolation trench 016, portions crossing along the first and second directions in the isolation trench lattice ("crossings") are not provided in the modified deep isolation trenches 017. In other words, the modified deep isolation trenches 017 are designed as non-continuous, discrete structures spaced apart from one another at the crossings. It has been found that, with the so-modified deep isolation trenches, the image sensor is greatly improved in terms of white pixels, but significant blooming and crosstalk problems arise due to the absence of physical isolation of the PDs 012 by the deep isolation trenches close to the crossings. Blooming is a phenomenon that a large number of electrons will be produced in a PD region being exposed to intense light and flow toward PDs in neighboring pixels. Identified as an important noise source for a PD array, crosstalk is defined as the injection of noise into an adjacent pixel in an image sensor. In essence, it is interfering noise caused by coupling of one signal to another. Crosstalk can reduce the clarity, and seriously degrade the quality, of a final output image.

Based on the above-described efforts, embodiments of the present invention provide an image sensor capable of also addressing the white pixel and blooming problems. The present invention will be described in greater detail below by way of specific embodiments with reference to the accompanying drawings. Features and advantages of the invention will be more apparent from the following detailed description. Note that the figures are provided in a very simplified form not necessarily drawn to exact scale and for the only purpose of facilitating easy and clear description of the embodiments.

For ease of description, relative spatial terms such as "above", "under", "upper" and "lower" may be used in the description of some embodiments disclosed herein to describe how one element or component is related to another element or component, or to other elements or components, as in the accompanying drawings illustrating the embodiments. It is to be understood that, apart from those shown, such relative spatial terms are also intended to describe various orientations that can be assumed in use or operation of the device shown. For example, if the device is turned upside down, then an element or component described as being "under" or "below" another element or component should now be described as being "above" or "on top of" the other element or component. As used hereinafter, the terms "first", "second" and the like may be used to distinguish between similar elements without necessarily implying any particular ordinal or chronological sequence. It is to be understood that the terms so used are interchangeable, whenever appropriate.

Embodiments of the present invention provide an image sensor, including:
 a semiconductor substrate having a first side and a second side opposite to the first side;
 a plurality of photodiodes (PDs) formed in the semiconductor substrate;
 a plurality of deep isolation trenches surrounding portions of the PDs close to the second side, the deep isolation trench extending from the second side toward the first side of the semiconductor substrate, each deep isolation trench is separated from any adjacent isolation trenches at a crossing they would have crossed each other if they further extended;
 second deep P-wells surrounding portions of the PDs close to the first side, the second deep P-wells extending from the first side toward the second side of the semiconductor substrate; and
 first deep P-well blocks, the first deep P-well blocks having projections on the semiconductor substrate, which encompass projections of said separated portions between any adjacent deep isolation trenches on the semiconductor substrate, the first deep P-well block extending from the second side toward the first side of the semiconductor substrate.

Figure 7:
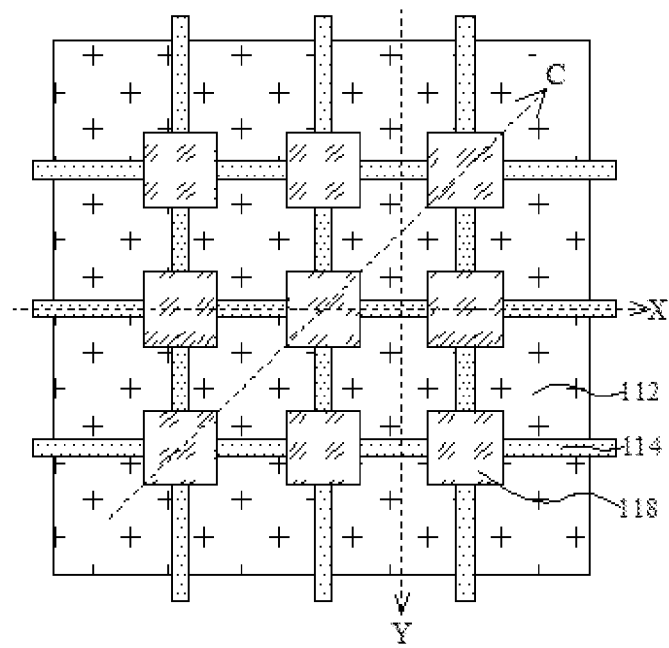
FIG. 7 is a schematic cross-sectional view of an image sensor according to an embodiment of the present invention, comprising first deep P-well blocks and second deep P-wells therein.
Figure 8:
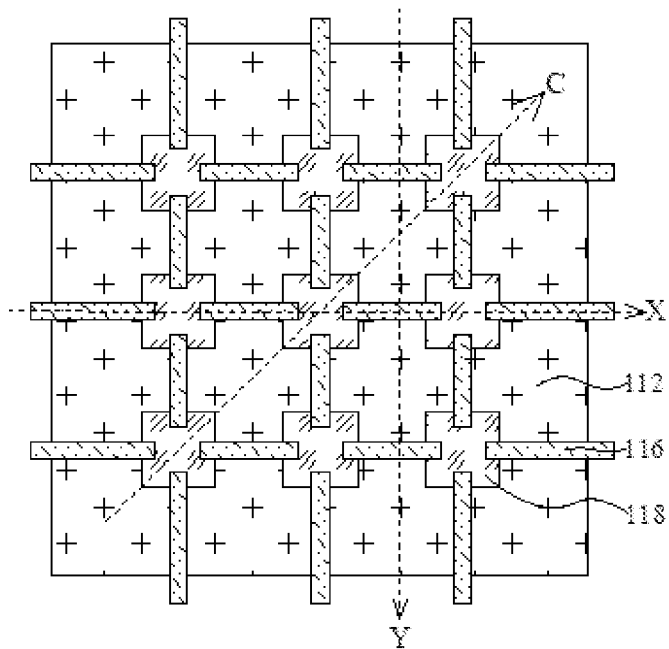
FIG. 8 is a schematic cross-sectional view of the image sensor according to an embodiment of the present invention, comprising deep isolation trenches and the first deep P-well blocks therein.
Figure 9:
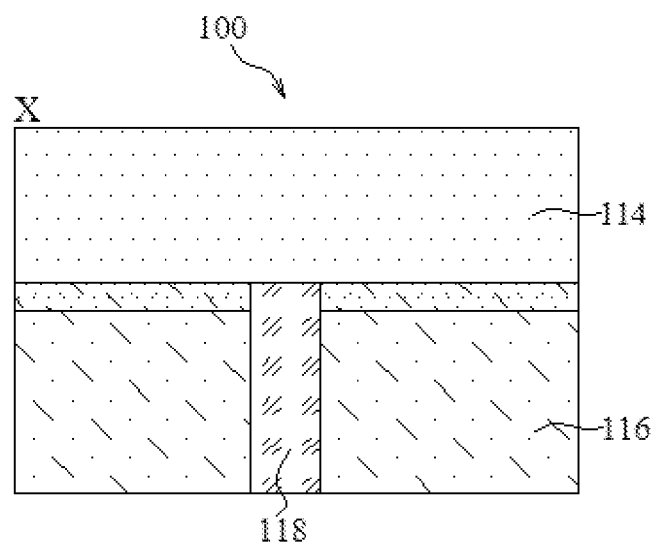
FIG. 9 is a schematic cross-sectional view of the image sensor according to an embodiment of the present invention taken along the X direction.
Figure 10:
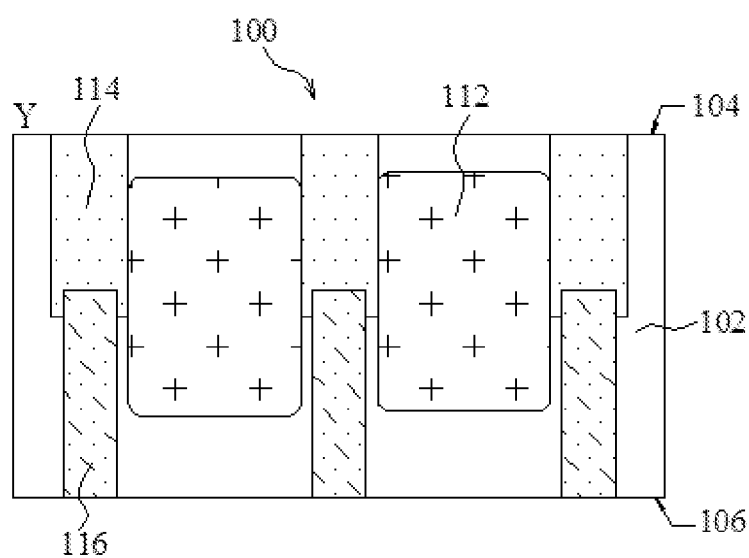
FIG. 10 is a schematic cross-sectional view of the image sensor according to an embodiment of the present invention taken along the Y direction.

The image sensor according to such embodiments of the present invention will be explained in greater detail below with reference to the FIGS. 7 to 11. FIG. 7 is a schematic cross-sectional view of the image sensor according to an embodiment of the present invention, comprising the first deep P-well blocks and the second deep P-wells. FIG. 8 is a schematic cross-sectional view of the image sensor according to an embodiment of the present invention, comprising the deep isolation trenches and the first deep P-well blocks. FIG. 9 is a schematic cross-sectional view of the image sensor according to an embodiment of the present invention taken along the X direction. FIG. 10 is a schematic cross-sectional view of the image sensor according to an embodiment of the present invention taken along the Y direction. FIG. 11 is a schematic cross-sectional view of the image sensor according to an embodiment of the present invention taken along the C (diagonal) direction.

As shown in FIGS. 7 to 11, the image sensor 100 according to these embodiments includes the semiconductor substrate 102, the PDs 112, the second deep P-wells 114, the isolation trenches 116 and the first deep P-well blocks 118.

The semiconductor substrate 102 has the first side 104 and the second 106 side opposite to the first side 104. The first side 104 is, for example, a front side of the semiconductor substrate 102. The second side 106 is, for example, a back side of the semiconductor substrate 102. The semiconductor substrate 102 may be a bulk silicon substrate, an epitaxial substrate, a doped (e.g., P- or N-type) silicon substrate, or a silicon-on-insulator (SOI) substrate. In some embodiments, the semiconductor substrate may have one or more of doped and/or undoped semiconductor regions, epitaxial silicon layers and other semiconductor structures formed on the substrate.

The PDs 112 are located in the semiconductor substrate 102 close to the first side 104. Image charges generated in response to incident light guided through the second side 106 are accumulated in the PDs 112.

The second deep P-wells 114 surround portions of the PDs 112 close to the first side 104 and extend from the first side 104 toward the second side 106 of the semiconductor substrate 102. The second deep P-wells 114 may include a plurality of second deep wells extending in a first direction X and a plurality of second deep wells which extend in a second direction Y and cross the second deep wells in a first direction X to form a deep well lattice. For example, the second deep P-wells 114 may extend into the semiconductor substrate 102 by a distance in the range of 2 µm to 5 µm.

The deep isolation trenches 116 surround portions of the PDs 112 close to the second side 106 and extend from the second side 106 toward the first side 104 of the semiconductor substrate 102. The deep isolation trench 116 has a thickness that is smaller than a thickness of the semiconductor substrate 102 defined between the first and second sides 104, 106. Each deep isolation trench 116 is spaced apart from any adjacent deep isolation trenches 116. Specifically, the deep isolation trenches 116 may make up a pattern of an isolation trench lattice having separated portions at the crossings, wherein the isolation trench lattice is formed by crossing a plurality of isolation trenches extending in the first direction X and a plurality of isolation trenches extending in the second direction Y. For example, depending on the thickness of the semiconductor substrate 102, each deep isolation trench 116 may extend into the semiconductor substrate 102 by a distance in the range of 2 µm to 5 µm within.

The second deep P-wells 114 are in positional correspondence with the deep isolation trenches 116 so that projections of the second deep P-wells 114 on the semiconductor substrate 102 encompass projections of the deep isolation trenches 116 on the semiconductor substrate 102. In a direction of the thickness of the semiconductor substrate 102, the second deep P-well 114 contacts or overlaps with a part of the deep isolation trench 116. For example, each of the deep isolation trench 116 and the second deep P-well 114 may extend in the longitudinal direction into the other over a small fraction of the thickness thereof.

The PD 112 in the image sensor 100 has a portion close to the first side 104 (i.e., an upper portion) surrounded by a cell of the deep P-well lattice formed by the second deep P-wells 114, and has a portion close to the second side 106 (i.e., a lower portion) surrounded by a cell of the isolation trench lattice formed by the deep isolation trenches 116. The deep isolation trenches 116 are formed by filling trenches with a dielectric material. Through surrounding the individual PDs, the deep isolation trenches 116 can isolate photocarriers. The second deep P-wells 114 and the deep isolation trenches 116 provide electrical and optical isolation between adjacent PDs 112. During the formation of the deep isolation trenches 116, more defects may result from an etching process for forming the deep trenches. After the formation of the trenches, such defects may be repaired by forming a thin lining oxide layer over surfaces of the trenches through performing an oxidation process for a short period of time.

The projections of the first deep P-well block 118 on the semiconductor substrate 102 encompass the projections of said separated portions between any adjacent deep isolation trenches 116 on the semiconductor substrate. The first deep P-well block 118 extends from the second side 106 toward the first side 104 of the semiconductor substrate 102.

For example, the first deep P-well blocks 118 are arranged in an array. Each first deep P-well block may be considered as a dot, so the array of the first deep P-well blocks 118 may be considered as a dot array. Compared with the second deep P-well, the first deep P-well block is located deeper in the semiconductor substrate. The projection of each deep P-well block on the semiconductor substrate 102 encompasses a corresponding separated portion between any adjacent deep isolation trenches 116. Moreover, the projection of each first deep P-well block on the semiconductor substrate 102 encompasses a corresponding crossing formed by the second deep P-well 114. In the direction of the thickness of the semiconductor substrate 102, the first deep P-well block 118 and the isolation trench 116 are located within the same depth range in the semiconductor substrate. Each of the separated portions (four corners) in the isolation trench lattice is situated within the first P-well block 118. In one embodiment, the first P-well block 118 extends longitudinally up to the second side 106. In another embodiment, the first P-well block 118 may extend longitudinally so as to not reach the second side 106. That is, lower end of the first P-well block (end thereof closer to the second side) remain within the semiconductor substrate. In the longitudinal direction, the first P-well block 118 may contact or overlap with a part of the second P-well 114.

Each PD 112 comprises a box-like structure. Those skilled in the art would appreciate that each PD 112 may include a doped region formed by longitudinally implanting a dopant which has an opposite conductivity type to that of the semiconductor substrate 102 into the semiconductor substrate 102 from the first side 104 by an ion implantation process. In one embodiment where the semiconductor substrate 102 is a P-doped semiconductor substrate, the formation of the doped region in each PD may involve implanting arsenic (As) or phosphorous as an N-type dopant into the semiconductor substrate 102 for multiple times using different implantation energies, thus forming a dopant distribution that results in a desired full-well capacity. However, in another example, the conductivity types of the layers/regions may be reversed. For example, the semiconductor substrate 102 may be an N-type semiconductor substrate, wherein the doped region in each PD may be formed by implantation of boron (B) as a P-type dopant. According to teachings of the present invention, the doped region in each PD may have a shape (e.g., a square, rectangular or circular shape, or any other suitable shape) and dimensions (e.g., length and width) determined according to the design requirements of the image sensor and a pixel size thereof.

As shown in FIG. 8, in one example, the PDs 112 may be arranged in an array of horizontal rows and vertical columns. The array has one layer of pixels in the direction of its depth. Therefore, in order to isolate each pixel from any adjacent pixels, each pixel may be surrounded by four deep isolation trenches 116 disposed on respective sides of the specific pixel. In one example, the outermost horizontal and vertical deep isolation trenches in the lattice may be omitted. In this case, each peripheral pixel is surrounded by three deep isolation trenches, except for the pixels at the corners of the array, each of which is surrounded by two deep isolation trenches. All of the other pixels are each surrounded by four deep isolation trenches 116 disposed on respective sides of the specific pixel. The deep isolation trench 116 may refer to either the whole lattice or a part thereof.

According to the present invention, the deeper P-wells 018 in FIG. 3 are modified into the first deep P-well blocks 118 in FIG. 8. In comparison with the deeper P-well 018 in FIG. 3, the formation of which requires the use of two photomasks, the first deep P-well blocks 118 according to the present invention can be formed in a single photolithography process using only one photomask, because shape maintenance of photoresist is enabled because of a sufficient spacing between adjacent first deep P-well blocks 118. This structural design of the first deep P-well block 118 according to the present invention results in reduced process cost and a shortened process time. Additionally, according to the present invention, as each of the deep isolation trenches surrounding the PDs is separated from any adjacent deep isolation trenches at a crossing where they would have crossed each other if they further extended, the image sensor is greatly improved in terms of white pixels. Further, the projections of the first deep well blocks on the semiconductor substrate encompass the projections of the separated portion between any adjacent isolation trenches on the semiconductor substrate. The first deep P-well block is arranged at the location where the isolation trenches are separated. The first deep P-well blocks are formed by implantation of P-type ions, which repairs damage caused by plasma used in a dry etching process for forming deep isolation trenches, additionally reducing white pixels and increasing pixel quality. Furthermore, the first deep P-well blocks provide electrical isolation at the separated portions between any adjacent isolation trenches. This avoids the phenomenon that a large number of electrons flow from a PD toward adjacent PDs, addressing the blooming and crosstalk problems that may arise from the discontinuation of the isolation trenches at the separated portions.

The present invention also provides a method for fabricating an image sensor, which, as shown in FIG. 12, includes:

providing a semiconductor substrate, which has a first side and a second side opposite to the first side, and photodiodes (PDs) are formed in semiconductor substrate;

forming deep isolation trenches surrounding portions of the PDs close to the second side, wherein the deep isolation trenches extend from the second side toward the first side of the semiconductor substrate, and wherein each deep isolation trench is separated from any adjacent isolation trench at a crossing where they would have crossed each other if they further extended toward the portion;

forming first deep P-well blocks by a first P-type ion implantation, wherein the first deep P-well blocks have projections on the semiconductor substrate, which encompass projections of the separated portions between any deep isolation trenches on the semiconductor substrate, wherein the first deep P-well block extends from the second side toward the first side of the semiconductor substrate; and forming second deep P-wells by a second P-type ion implantation, wherein the second deep P-wells surround portions of the PDs close to the first side, wherein the second deep P-wells extend from the first side toward the second side of the semiconductor substrate.

Specifically, as shown in FIGS. 7 to 11, the provided semiconductor substrate 102 may be a silicon substrate or made of any material suitable for use in CMOS image sensors, such as germanium, silicon germanium, silicon carbide, gallium arsenide or indium gallium. Alternatively, the semiconductor substrate 102 may be a silicon-on-insulator (SOI) substrate, a germanium-on-insulator (GOI) substrate, or a substrate with a grown epitaxial layer. The semiconductor substrate 100 comprises pixel devices in which the PDs 112 may be included. Specifically, the PDs 102 can generate photo-generated carriers, i.e., electrons, when exposed to external light. The PDs 102 may be formed using an ion implantation process, in which ions can be implanted within a desired range to a desired depth by controlling the implantation energy and dose used. In this way, the PDs 102 can have a desired depth and a desired thickness.

The deep isolation trenches 116 surround portions of the PDs 112 close to the second side 106 and extend from the second side 106 toward the first side 104 of the semiconductor substrate 102. Each deep isolation trench 116 is separated from any adjacent isolation trenches at a crossing where they would have crossed each other if they further extended. The deep isolation trenches 116 may be formed by forming deep trenches by performing a dry etching process on the second side 106 of the semiconductor substrate 102, which proceeds toward the first side, and by filling the deep trenches with a dielectric material.

The first deep P-well block 118 is formed by the first P-type ion implantation. The projections of the first deep P-well blocks on the semiconductor substrate 102 encompass the projections of the separated portions between any adjacent deep isolation trenches on the semiconductor substrate 102. The first deep P-well block 118 extends from the second side toward the first side of the semiconductor substrate 102.

The second deep P-wells 114 are formed by the second P-type ion implantation and surround portions of the PDs 112 close to the first side 104. The second deep P-well 114 extends from the first side 104 toward the second side 106 of the semiconductor substrate 102.

The first deep P-well block 118 is formed deeper in the semiconductor substrate 102 than the second deep P-well 114. Therefore, the first deep P-well block is formed using greater implantation energy than that used to form the second deep P-well 114. In order to prevent overflow of electrons to adjacent pixels, which may lead to crosstalk, the ions for forming the first deep P-well block 118 is implanted to a depth that is greater than a depth where N-type ions are implanted to form the PDs 112. These implantation depths can be achieved by implantation energy control, and an isolation effect of the first deep P-well blocks 118 depends on a dose of the implanted ions.

In particular, in the first P-type ion implantation for forming the first deep P-well blocks 118, boron (B) ions may be implanted at an implantation energy that may range from 800 Kev to 1200 Kev and a dose of, for example, 200E3 cm$^{-3}$ to 500E3 cm$^{-3}$. In the second P-type ion implantation for forming the second deep P-wells 114, boron (B) ions may be implanted at an implantation energy that may range from 600 Kev to 900 Kev and a dose of, for example, 200E3 cm$^{-3}$ to 500E3 cm$^{-3}$.

In summary, the present invention provides an image sensor and a method for fabricating the image sensor. The image sensor includes: a semiconductor substrate having a first side and a second side opposite to the first side; photodiodes (PDs) in the semiconductor substrate; deep isolation trenches surrounding portions of the PDs close to the second side, the deep isolation trenches extending from the second side toward the first side of the semiconductor substrate, each deep isolation trench is separated from any adjacent isolation trenches at a crossing if they further extended; the second deep P-wells surrounding portions of the PDs close to the first side, the second deep P-well extending from the first side toward the second side of the semiconductor substrate; and the first deep P-well blocks having projections on the semiconductor substrate, which encompass projections of said separated portions between any adjacent deep isolation trenches on the semiconductor substrate, the first deep P-well block extending from the second side toward the first side of the semiconductor substrate.

According to the present invention, the first deep P-well block can be formed in a single photolithography process using only one photomask, as shape maintenance of photoresist is enabled because of a sufficient spacing between adjacent first deep P-well blocks. This structural design of the first deep P-well block according to the present invention results in reduced process cost and a shortened process time. Additionally, according to the present invention, as the deep isolation trenches surrounding the PDs are separated from any adjacent deep isolation trenches at a crossing where they would have crossed each other if they further extended, the image sensor is greatly improved in terms of white pixels. Further, the projections of the first deep P-well blocks on the semiconductor substrate encompass the projections of the separated portions between any adjacent deep isolation trenches on the semiconductor substrate. The separated portions in the deep isolation trenches are arranged in the first P-deep well blocks. The first P-deep well blocks are formed by implantation of P-type ions, which repairs damage caused by plasma used in a dry etching process for forming trenches for the deep isolation trenches, additionally reducing white pixels and increasing pixel quality. Furthermore, the first P-deep well blocks provide electrical isolation at the separated portions of the deep isolation trenches. This avoids the phenomenon that a large number of electrons flow from a PD toward adjacent PDs, addressing the blooming and crosstalk problems that may arise from the discontinuation of the deep isolation trenches at the separated portions.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details of them.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:
1. An image sensor, comprising:
a semiconductor substrate having a first side and a second side opposite to the first side; and a plurality of image sensor units, wherein each image sensor unit comprises:

four deep isolation trenches formed in the semiconductor substrate and substantially arranged in a rectangle, wherein the four deep isolation trenches are separated from one another at four corners of the rectangle, and wherein each deep isolation trench extends from the second side to the first side of the semiconductor substrate;

four first deep P-well blocks formed in the semiconductor substrate and located at the four corners of the rectangle, wherein each first P-well block extends from the second side to the first side of the semiconductor substrate;

four second deep P-wells formed in the semiconductor substrate and in positional correspondence with the four deep isolation trenches, wherein each second P-well extends from the first side to the second side of the semiconductor substrate; and an photodiode (PD) formed in the semiconductor substrate, wherein a portion of the photodiode close to the second side is surrounded by the four deep isolation trenches and the four first deep P-well blocks, and wherein a portion of the photodiode close to the first side is surrounded by the four second deep P-wells.

2. The image sensor of claim 1, wherein a width of the second deep P-well is greater than a width of the deep isolation trench.

3. The image sensor of claim 1, wherein each end of the deep isolation trench contacts with or extends into the first deep P-well block in a lateral direction.

4. The image sensor of claim 1, wherein in a thickness direction of the semiconductor substrate, the second deep P-well contacts or partially overlaps with the deep isolation trench.

5. The image sensor of claim 1, wherein in a thickness direction of the semiconductor substrate, the first deep P-well block and the deep isolation trench extend a substantially same depth from the second side to the first side of the semiconductor substrate.

6. A method for fabricating an image sensor including at least one image sensor unit, comprising:

providing a semiconductor substrate having a first side and a second side opposite to the first side; and forming a plurality of deep isolation trenches in the semiconductor substrate, wherein the plurality of deep isolation trenches comprise four deep isolation trenches that are substantially arranged in a rectangle, wherein the four deep isolation trenches are separated from one another at four corners of the rectangle, and wherein each deep isolation trench extends from the second side to the first side of the semiconductor substrate;

forming a plurality of first deep P-well blocks in the semiconductor substrate, wherein the plurality of first deep P-well blocks comprise four first deep P-well blocks located at the four corners of the rectangle, wherein each first P-well block extends from the second side to the first side of the semiconductor substrate;

forming a plurality of second deep P-wells in the semiconductor substrate, wherein the plurality of second deep P-wells comprise four second deep P-wells in positional correspondence with the four deep isolation trenches, wherein each second P-well extends from the first side to the second side of the semiconductor substrate; and forming at least one photodiode in the semiconductor substrate, wherein a portion of the photodiode close to the second side is surrounded by the four deep isolation trenches and the four first deep P-well blocks, and wherein a portion of the photodiode close to the first side is surrounded by the four second deep P-wells.

7. The method of claim 6, wherein an implantation energy used to form the first deep P-well block is greater than an implantation energy used to form the second deep P-well.

8. The method of claim 6, wherein a width of the second deep P-well is greater than a width of the deep isolation trench.

9. The method of claim 6, wherein each end of the deep isolation trench contacts with or extends into the first deep P-well block in a lateral direction.

10. The method of claim 6, wherein in a thickness direction of the semiconductor substrate, the second deep P-well contacts or partially overlaps with the deep isolation trench.

11. The method of claim 6, wherein in a thickness direction of the semiconductor substrate, the first deep P-well block and the deep isolation trench extend a substantially same depth from the second side to the first side of the semiconductor substrate.

* * * * *